(12) United States Patent
Choi et al.

(10) Patent No.: US 11,846,038 B2
(45) Date of Patent: Dec. 19, 2023

(54) METHOD OF GROWING SEMI-INSULATING SILICON CARBIDE SINGLE CRYSTAL USING DOPANT COATED WITH A CARBON-BASED MATERIAL

(71) Applicant: SENIC Inc., Chungcheongnam-do (KR)

(72) Inventors: Jung Woo Choi, Gyeonggi-do (KR); Jung-Gyu Kim, Gyeonggi-do (KR); Kap-Ryeol Ku, Gyeonggi-do (KR); Sang Ki Ko, Gyeonggi-do (KR); Byung Kyu Jang, Gyeonggi-do (KR)

(73) Assignee: SENIC Inc., Chungcheongnam-do (KR)

( * ) Notice: Subject to any disclaimer, the term of this patent is extended or adjusted under 35 U.S.C. 154(b) by 268 days.

(21) Appl. No.: 17/268,189

(22) PCT Filed: Jul. 26, 2019

(86) PCT No.: PCT/KR2019/009314
§ 371 (c)(1),
(2) Date: Feb. 12, 2021

(87) PCT Pub. No.: WO2020/045833
PCT Pub. Date: Mar. 5, 2020

(65) Prior Publication Data
US 2021/0317595 A1    Oct. 14, 2021

(30) Foreign Application Priority Data

Aug. 30, 2018 (KR) .................. 10-2018-0102806
Aug. 30, 2018 (KR) .................. 10-2018-0102822
Sep. 6, 2018 (KR) .................. 10-2018-0106272

(51) Int. Cl.
C30B 23/02    (2006.01)
C30B 23/00    (2006.01)
C30B 29/36    (2006.01)

(52) U.S. Cl.
CPC ............ *C30B 23/005* (2013.01); *C30B 23/02* (2013.01); *C30B 29/36* (2013.01)

(58) Field of Classification Search
CPC ..... C30B 23/00; C30B 23/002; C30B 23/005; C30B 23/02; C30B 23/06; C30B 23/066;
(Continued)

(56) References Cited

FOREIGN PATENT DOCUMENTS

CN    207391600 U    5/2018
JP    10-291899 A    11/1998
(Continued)

OTHER PUBLICATIONS

Office Action for the Chinese Patent Application No. 201980056925.9 issued by the Chinese Patent Office dated Jan. 26, 2022.

*Primary Examiner* — Kenneth A Bratland, Jr.
(74) *Attorney, Agent, or Firm* — IP & T GROUP LLP

(57) ABSTRACT

A method of growing a semi-insulating SiC single crystal ingot, the method comprising the steps of: (1) placing a dopant coated with silicon carbide (SiC) and a carbon-based material into a reaction vessel containing a seed crystal fixed thereto; and (2) growing a SiC single crystal on the seed crystal, thereby yielding a high-quality semi-insulating SiC single crystal ingot with a uniform thickness-based doping concentration. In addition, another embodiment relates to a method of growing a semi-insulating silicon carbide single crystal ingot, the method comprising the steps of: (a) placing in a reaction vessel, a composition comprising a carbon-containing polymer resin, a solvent, a dopant, and silicon carbide (SiC); (b) solidifying the composition; and (c) growing a SiC single crystal ingot on a seed crystal fixed to the reaction vessel, thereby yielding a high-quality semi-insulating SiC single crystal ingot with a uniform thickness-based doping concentration.

8 Claims, 12 Drawing Sheets

(58) Field of Classification Search
CPC ......... C30B 29/00; C30B 29/10; C30B 29/36;
C30B 35/00; C30B 35/002; C30B 35/007;
C23C 14/00; C23C 14/06; C23C 14/0635
USPC .......... 117/84, 106, 109, 200, 204, 937, 951
See application file for complete search history.

(56) References Cited

FOREIGN PATENT DOCUMENTS

| | | | |
|---|---|---|---|
| JP | 2000-264795 | A | 9/2000 |
| JP | 2002-234800 | A | 8/2002 |
| JP | 2002-293525 | A | 10/2002 |
| JP | 2002293525 | A * | 10/2002 |
| JP | 2010-248025 | A | 11/2010 |
| KR | 10-2007-0009567 | A | 1/2007 |
| KR | 10-2013-0074714 | A | 7/2013 |
| KR | 10-1614325 | B1 * | 4/2016 |
| KR | 10-2016-0049590 | A | 5/2016 |
| KR | 10-2017-0073834 | A | 6/2017 |

* cited by examiner

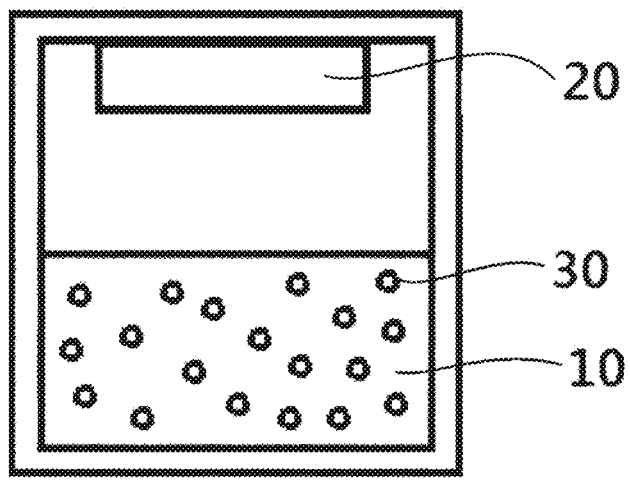
[Fig. 1]
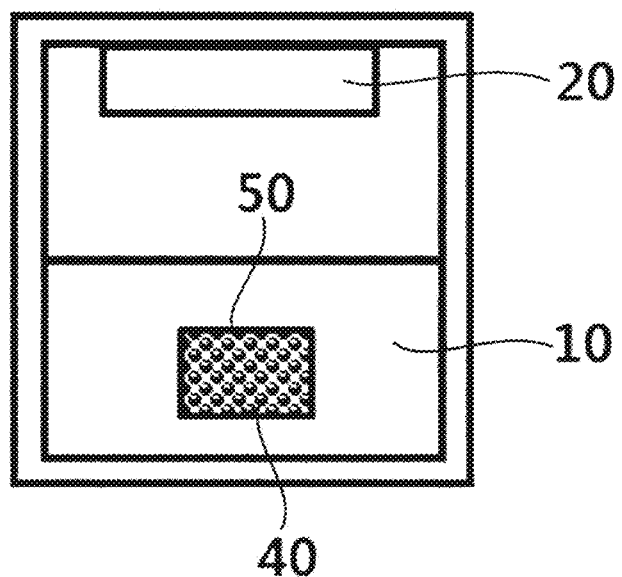
[Fig. 2]

[Fig. 3]
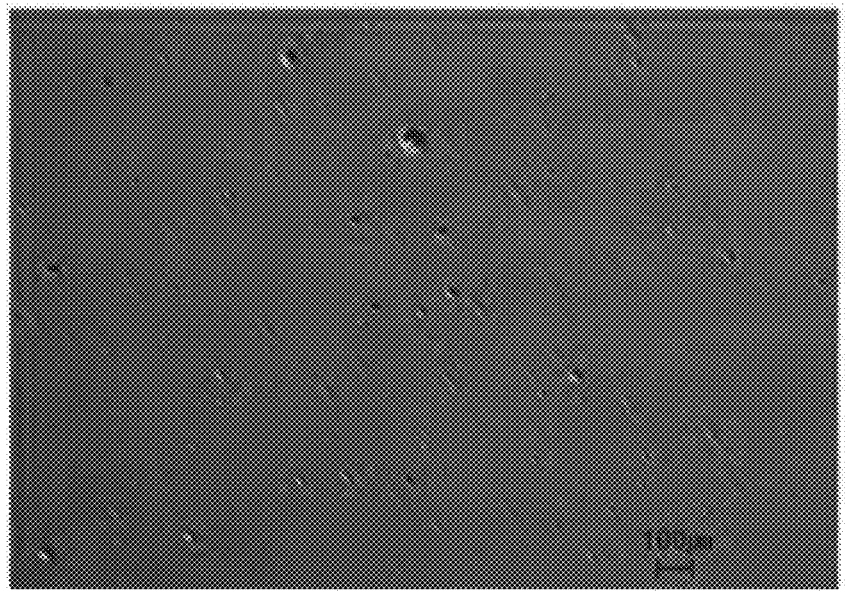
[Fig. 4]
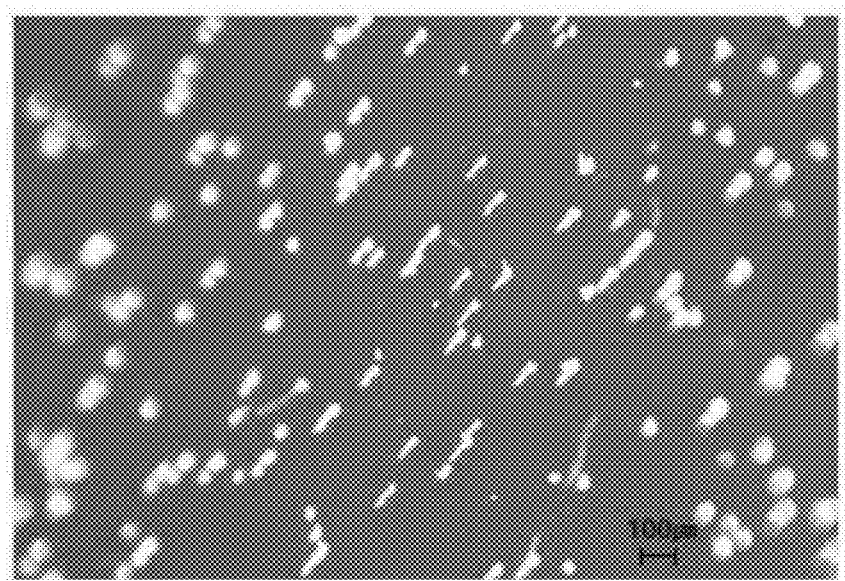

[Fig. 5]
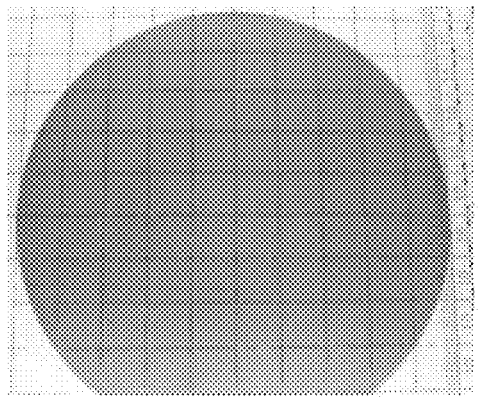
[Fig. 6]
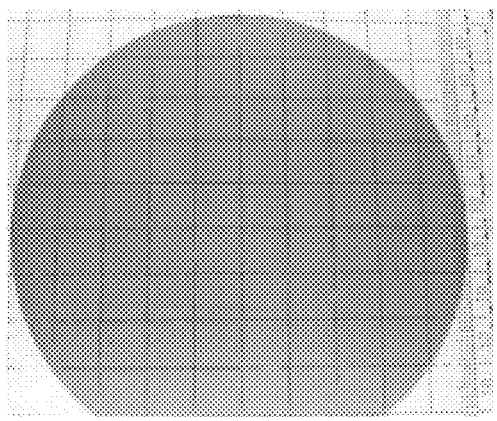
[Fig. 7]
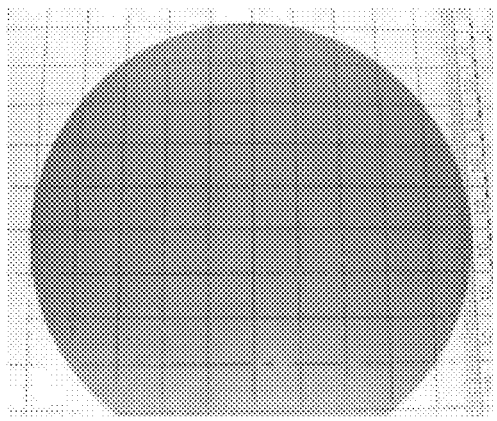

[Fig. 8]
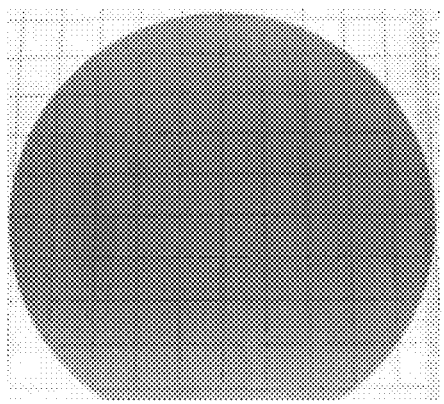
[Fig. 9]
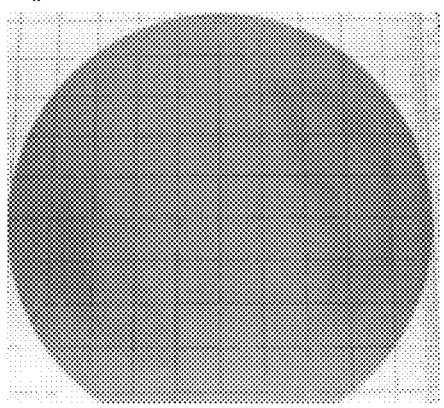
[Fig. 10]
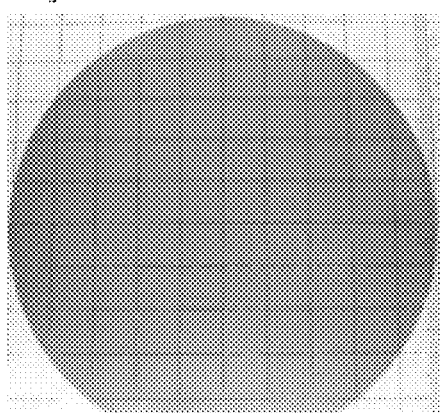

[Fig. 11]
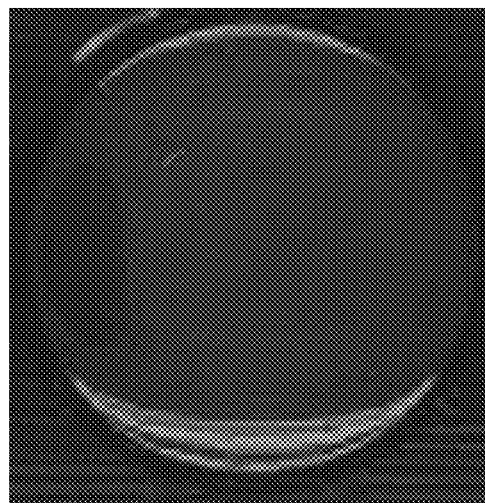
[Fig. 12]
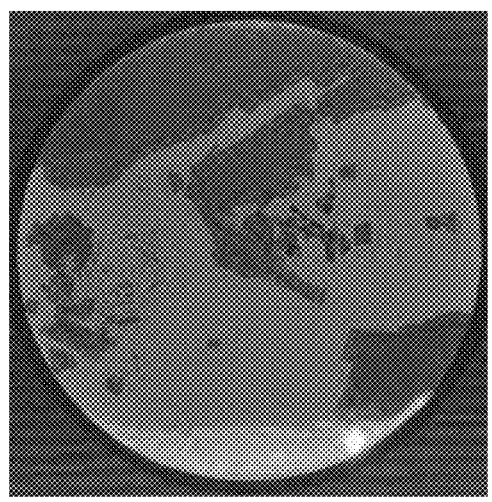

[Fig. 13]
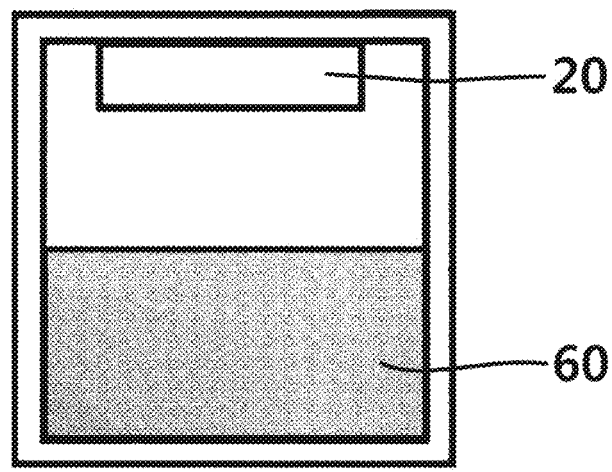
[Fig. 14]
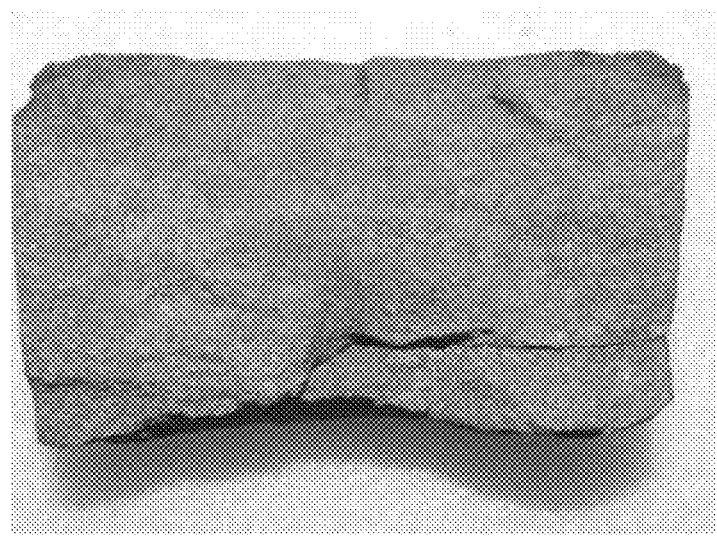

[Fig. 15]
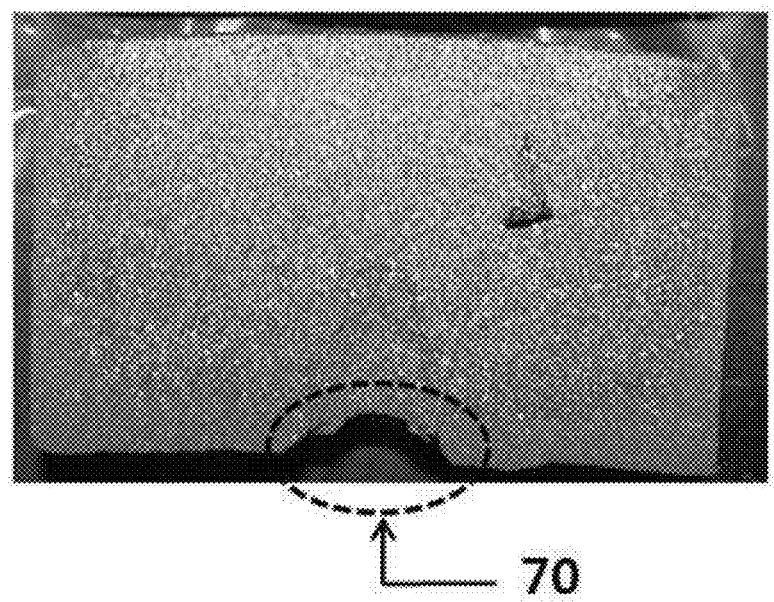
70
[Fig. 16]
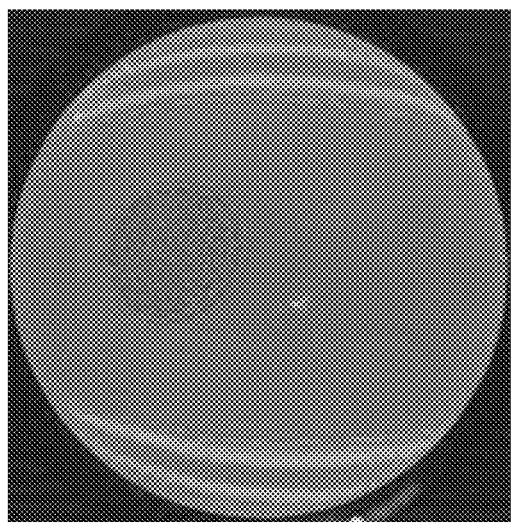

[Fig. 17]
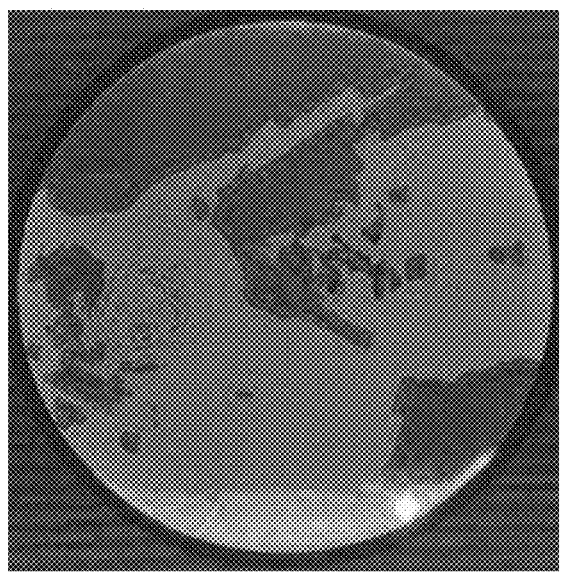
[Fig. 18]
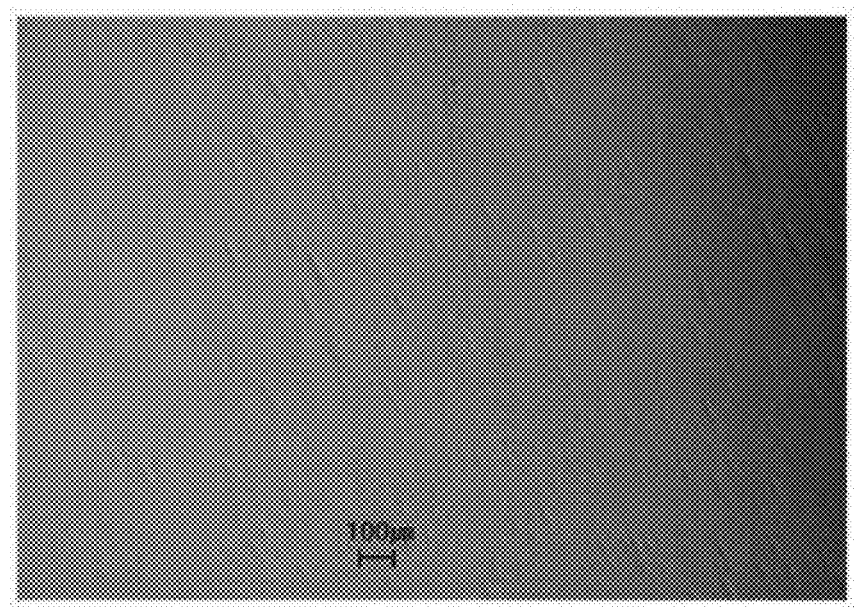

[Fig. 19]
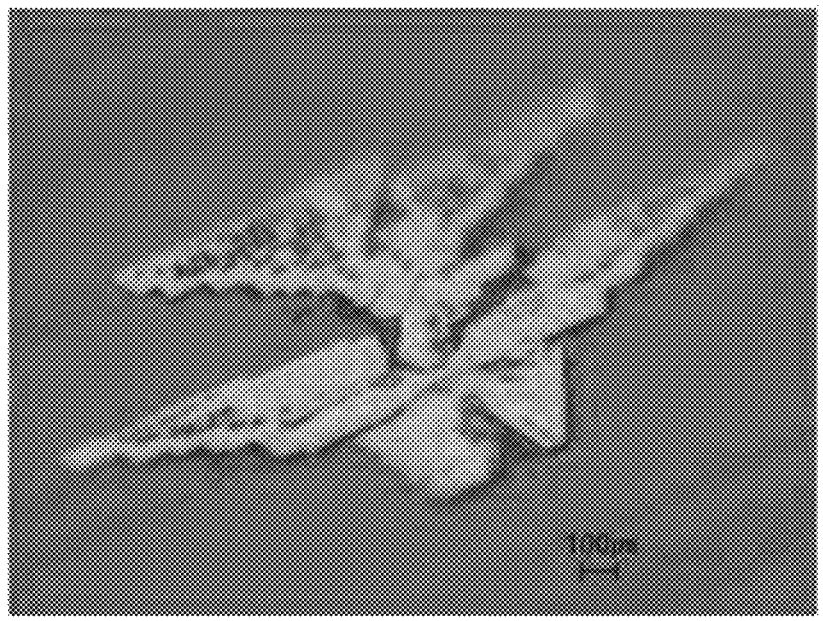
[Fig. 20]
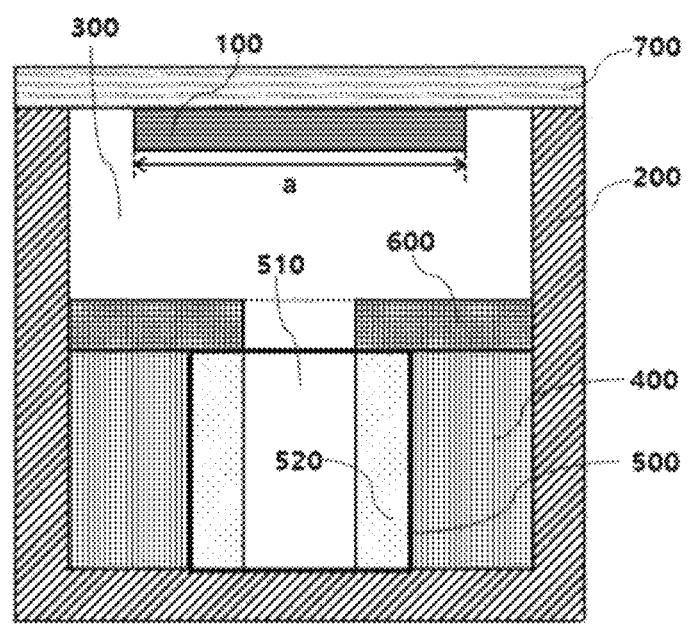

[Fig. 21]
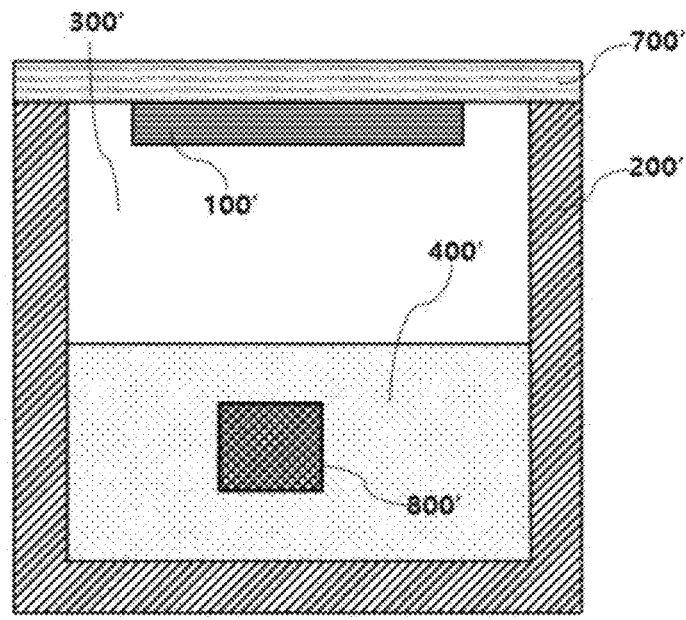
[Fig. 22]
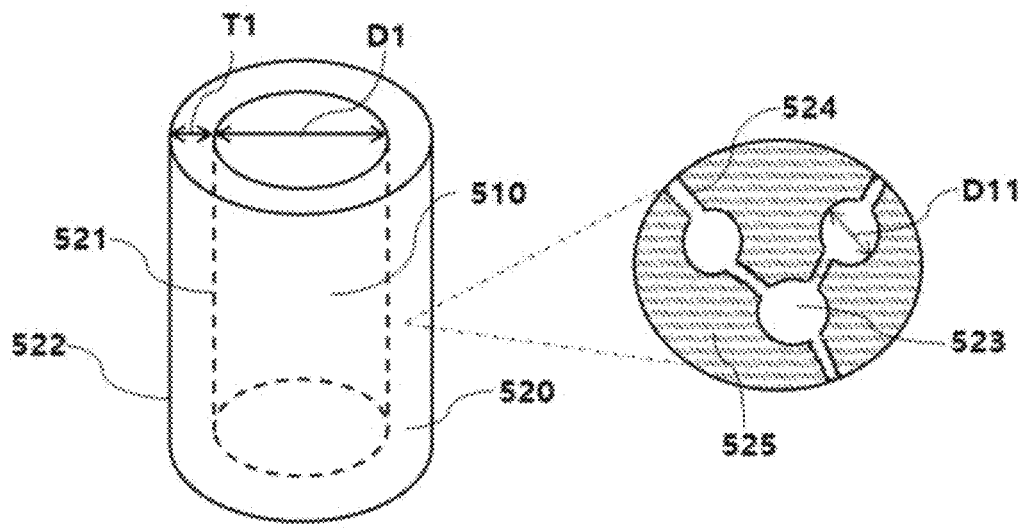

[Fig. 23]
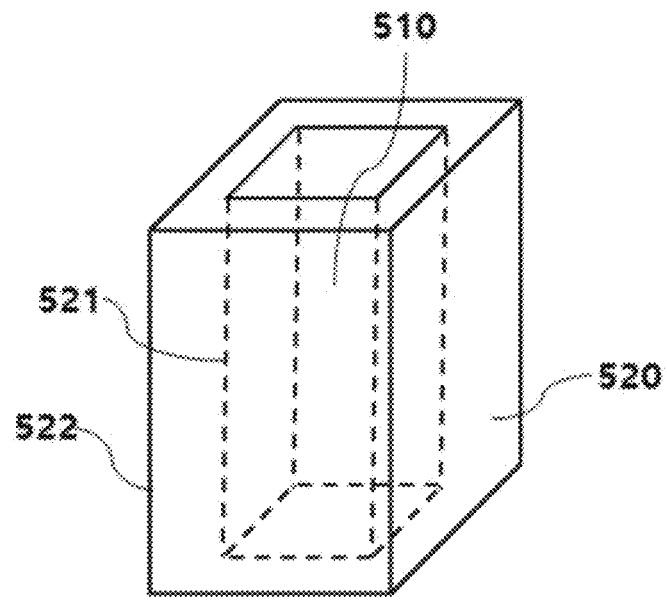
[Fig. 24]
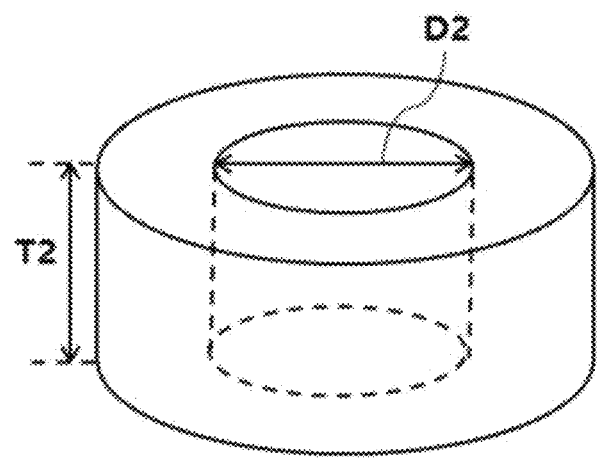

[Fig. 25]
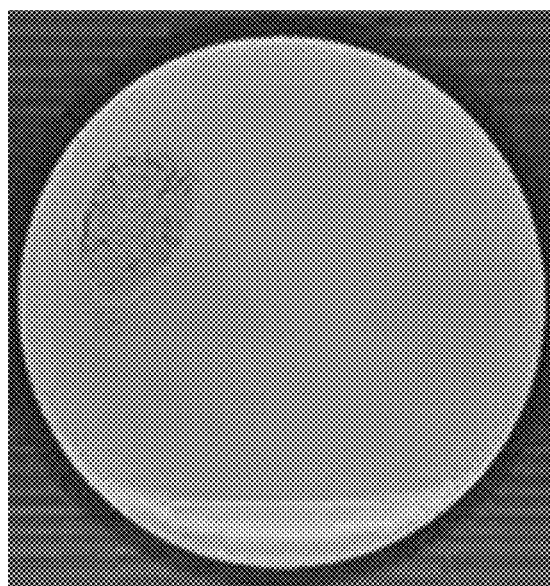
[Fig. 26]
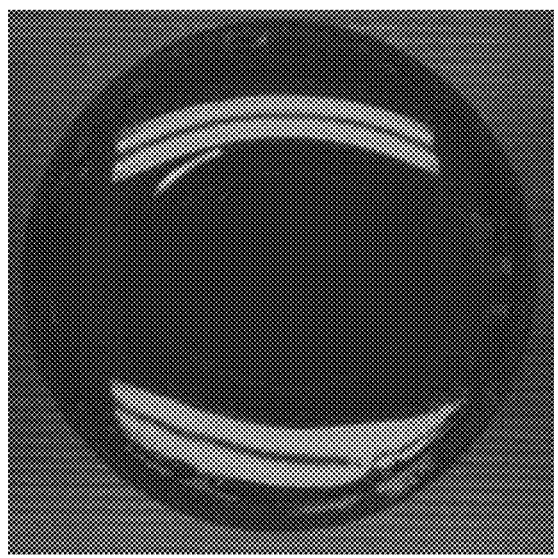

ions of Korean patent application number 10-2018-0102806 filed on Aug. 30, 2018, 10-2018-0102822 filed on Aug. 30, 2018 and 10-2018-0106272 filed on Sep. 6, 2018, The disclosure of each of the foregoing applications is incorporated herein by reference in its entirety.

METHOD OF GROWING SEMI-INSULATING SILICON CARBIDE SINGLE CRYSTAL USING DOPANT COATED WITH A CARBON-BASED MATERIAL

This application is a national stage application of PCT/KR2019/009314 filed on Jul. 26, 2019, which claims priorities of Korean patent application number 10-2018-0102806 filed on Aug. 30, 2018, 10-2018-0102822 filed on Aug. 30, 2018 and 10-2018-0106272 filed on Sep. 6, 2018, The disclosure of each of the foregoing applications is incorporated herein by reference in its entirety.

TECHNICAL FIELD

An embodiment relates to a process for growing a semi-insulating SiC single crystal ingot using a dopant coated with a carbon-based material or a process for growing a semi-insulating SiC single crystal ingot by solidifying a composition comprising a carbon-containing polymer resin, a solvent, a dopant, and SiC.

In addition, an embodiment relates to an apparatus for growing a SiC single crystal ingot, which comprises a porous body prepared through carbonization or graphitization of a SiC composition.

BACKGROUND ART

Silicon carbide (SiC) has the advantages that it is excellent in thermal resistance and mechanical strength, is resistant to radiation, and can be produced as a substrate having a large diameter. Thus, research has been actively conducted for development as a substrate for next-generation power semiconductor devices. In particular, single crystal silicon carbide (SiC) has a large energy band gap and is excellent in maximum break field voltage and thermal conductivity as compared with silicon (Si). In addition, the carrier mobility of single crystal silicon carbide is comparable to that of silicon, and the saturation drift rate of electrons and the breakdown voltage thereof are large as well. Accordingly, single crystal silicon carbide is expected to be applied to semiconductor devices that require high power, high efficiency, high breakdown voltage, and large capacity.

In recent years, gallium nitride (GaN) and aluminum nitride (AlN) are attracting attention as materials for high-frequency semiconductor devices. In such a substrate for high-frequency semiconductor devices, it is indispensable to increase the resistance of the substrate (e.g., $1 \times 10^5$ Ωcm or more), that is, to make a semi-insulating state in order to enhance the quality of the crystals in the SiC substrate and prevent a short circuit with other elements.

Conventionally, a method of mixing and synthesizing a dopant with SiC has been used in order to prepare a semi-insulating SiC single crystal ingot. However, since the dopant and SiC are different in the sublimation temperature, the dopant is sublimated first. For example, the sublimation temperature of a vanadium dopant is about 1,910° C., and the sublimation temperature of SiC is about 2,700° C. Thus, vanadium is sublimated first. Thus, since the doping concentration varies with the thickness of the ingot, there arises a problem that the resistivity varies with the thickness of the ingot. Specifically, doping is excessively carried out at the initial stage in the growth of a SiC single crystal ingot, and doping is carried out to a less extent at the final stage in the growth of the SiC single crystal ingot, whereby the doping concentration varies with the thickness of the SiC single crystal ingot.

In addition, in the growth of a SiC single crystal ingot, SiC may bounce and adhere to the seed crystal due to the thermal vibration or may interfere with the formation of a SiC flux pattern. Thus, the growth of a semi-insulating SiC single crystal ingot may be inhibited, resulting in a deterioration in the quality.

In order to solve the above problems, a method of loading a dopant to a porous graphite container or having a dopant contained in the SiC powder through synthesis has been used. However, this process has a disadvantage in that it is complicated and that the cost is increased. In addition, since it is difficult to control the doping concentration due to the impurities formed in the porous graphite container, the quality of the semi-insulating SiC single crystal ingot can be hardly enhanced. In addition, in order to solve the above problems, SiC and a dopant have been pulverized, or those having a large particle size have been used. However, this process has a disadvantage in that a separate thermal treatment step for the powder is required.

In addition, in recent years, as the diameter of a SiC single crystal ingot increases, the size of the reaction vessel for growing the SiC single crystal ingot increases proportionally. However, as the size of the reaction vessel increases, a lot of energy is required to heat up to the temperature for growing the SiC single crystal ingot, and there is a disadvantage in that the temperature gradient to the center of the reaction vessel is not uniform. Thus, the supply of a raw material is not uniform due to the high difference in temperature between the edge and the center of the ingot, and a convex shape of the center of the ingot or a loss of the end of the ingot occurs, resulting in a deterioration in the quality of the ingot.

Accordingly, research has been continued to develop a process for growing a semi-insulating SiC single crystal ingot that creates a semi-insulating state without deteriorating the quality of the SiC single crystal ingot and an apparatus for growing a SiC single crystal ingot.

DETAILED DESCRIPTION OF THE INVENTION

Technical Problem

An embodiment aims to provide a semi-insulating SiC single crystal ingot of high quality, in which the doping concentration with respect to the thickness of the SiC single crystal ingot is uniform, by growing the semi-insulating SiC single crystal ingot using a dopant coated with a carbon-based material.

Another embodiment aims to provide a semi-insulating SiC single crystal ingot of high quality, in which the doping concentration with respect to the thickness of the SiC single crystal ingot is uniform, by solidifying a composition comprising a carbon-containing polymer resin, a solvent, a dopant, and SiC and then growing the semi-insulating SiC single crystal ingot.

Still another embodiment aims to provide an apparatus for growing a SiC single crystal ingot, which comprises a porous body prepared through carbonization or graphitization of a SiC composition and is capable of preparing a SiC single crystal ingot of high quality, in which the doping concentration with respect to the thickness thereof is uniform even in the case where the diameter of the SiC single crystal ingot is large.

Solution to the Problem

The process for growing a semi-insulating SiC single crystal ingot according to an embodiment comprises (1)

loading SiC (silicon carbide) and a dopant coated with a carbon-based material to a reaction vessel mounted with a seed crystal; and (2) growing a SiC single crystal ingot on the seed crystal.

The process for growing a semi-insulating SiC single crystal ingot according to another embodiment comprises (a) loading a composition comprising a carbon-containing polymer resin, a solvent, a dopant, and SiC (silicon carbide) to a reaction vessel; (b) solidifying the composition; and (c) growing a SiC single crystal ingot on a seed crystal provided in the reaction vessel.

The apparatus for growing a SiC single crystal ingot according to still another embodiment comprises a seed crystal having a predetermined diameter; and a reaction vessel for growing an ingot on the surface of the seed crystal while the seed crystal is fixed therein, wherein the reaction vessel comprises an ingot growing unit that forms at least a part of the upper region of the reaction vessel and that fixes the seed crystal at the upper end; a filter unit that comprises an opening unit forming the inner center and a porous body surrounding the opening unit and that forms at least a part of the lower region of the reaction vessel while being located under the seed crystal; a raw material receiving unit that is located between the porous body and the inner wall of the reaction vessel, that forms at least a part of the lower region of the reaction vessel, and that receives a raw material of the ingot therein; and a blocking unit that is positioned at the upper end of the raw material receiving unit and at the upper end of the porous body.

Advantageous Effects of the Invention

According to the process for growing a semi-insulating SiC single crystal ingot according to the embodiment, it is possible to prevent the phenomenon that the dopant is sublimated before SiC and to minimize the non-uniformity of the doping concentration with respect to the thickness of the SiC single crystal ingot, thereby enhancing the quality of the semi-insulating SiC single crystal ingot.

In addition, according to the process for growing a semi-insulating SiC single crystal ingot according to the embodiment, it is possible to grow a semi-insulating SiC single crystal ingot through a simple process and to minimize the amount of the unreacted raw material, thereby reducing the cost.

In addition, according to the process for growing a semi-insulating SiC single crystal ingot according to the embodiment, it is possible to suppress unintended mixing of impurities and to readily control the doping.

In addition, according to the process for growing a semi-insulating SiC single crystal ingot according to the embodiment, it is possible to readily adjust the doping content and to prevent agglomeration in some regions.

The apparatus for growing a SiC single crystal ingot according to the embodiment can minimize the amount of the unreacted raw material, thereby reducing the cost.

In addition, according to the apparatus for growing a SiC single crystal ingot according to the embodiment, it is possible to prevent the dopant from being sublimated before SiC and to minimize the non-uniformity of the temperature gradient in the ingot growing unit, thereby preparing a SiC single crystal ingot with enhanced shape, growth rate, and quality.

In addition, according to the apparatus for growing a SiC single crystal ingot according to the embodiment, it is possible to suppress unintended mixing of impurities and to readily control the doping.

Further, the apparatus for growing a SiC single crystal ingot according to the embodiment is suitable for preparing a SiC single crystal ingot having a large diameter.

BRIEF DESCRIPTION OF THE DRAWINGS

FIG. 1 shows a cross-sectional view of the reaction vessel for growing a semi-insulating SiC single crystal ingot according to an embodiment.

FIG. 2 shows a cross-sectional view of the conventional reaction vessel for growing a semi-insulating SiC single crystal ingot.

FIG. 3 shows a surface image of the semi-insulating SiC single crystal ingot of Example 1.

FIG. 4 shows a surface image of the semi-insulating SiC single crystal ingot of Comparative Example 1.

FIG. 5 shows the doping concentration at the initial stage in the growth of the semi-insulating SiC single crystal ingot of Example 1.

FIG. 6 shows the doping concentration at the intermediate stage in the growth of the semi-insulating SiC single crystal ingot of Example 1.

FIG. 7 shows the doping concentration at the final stage in the growth of the semi-insulating SiC single crystal ingot of Example 1.

FIG. 8 shows the doping concentration at the initial stage in the growth of the semi-insulating SiC single crystal ingot of Comparative Example 1.

FIG. 9 shows the doping concentration at the intermediate stage in the growth of the semi-insulating SiC single crystal ingot of Comparative Example 1.

FIG. 10 shows the doping concentration at the final stage in the growth of the semi-insulating SiC single crystal ingot of Comparative Example 1.

FIG. 11 shows a UV image of the semi-insulating SiC single crystal ingot of Example 1.

FIG. 12 shows a UV image of the semi-insulating SiC single crystal ingot of Comparative Example 1.

FIG. 13 shows a cross-sectional view of the reaction vessel for growing a semi-insulating SiC single crystal ingot according to another embodiment.

FIG. 14 shows a cross-sectional image of residual powder of the semi-insulating SiC single crystal ingot of Example 2.

FIG. 15 shows a cross-sectional image of residual powder of the semi-insulating SiC single crystal ingot of Comparative Example 2.

FIG. 16 shows a UV image of the semi-insulating SiC single crystal ingot of Example 2.

FIG. 17 shows a UV image of the semi-insulating SiC single crystal ingot of Comparative Example 2.

FIG. 18 shows a surface image of the semi-insulating SiC single crystal ingot of Example 2.

FIG. 19 shows a surface image of the semi-insulating SiC single crystal ingot of Comparative Example 2.

FIG. 20 shows a cross-sectional view of the apparatus for growing a SiC single crystal ingot according to an embodiment.

FIG. 21 shows a cross-sectional view of the conventional apparatus for growing a SiC single crystal ingot.

FIG. 22 shows a filter unit of the apparatus for growing a SiC single crystal ingot according to an embodiment.

FIG. 23 shows a filter unit of the apparatus for growing a SiC single crystal ingot according to another embodiment.

FIG. 24 shows a blocking unit of the apparatus for growing a SiC single crystal ingot according to an embodiment.

FIG. 25 shows a UV image of the SIC single crystal ingot of Example 3.

FIG. 26 shows a UV image of the SIC single crystal ingot of Comparative Example 3.

REFERENCE NUMERALS OF THE DRAWINGS

10: SiC
20, 100, 100': seed crystal
30: dopant coated with a carbon-based material
40: dopant
50: porous graphite container
60: solidified composition
70: location where the porous graphite container was
200, 200': reaction vessel
300, 300': ingot growing unit
400, 400': raw material receiving unit
500: filter unit
510: opening unit
520: porous body
521: inner circumferential surface of a porous body
522: outer circumferential surface of a porous body
523: pore
524: flowing path
525: pore wall
600: blocking unit
700, 700': reaction vessel cap
800': porous graphite container loaded with a dopant a: diameter of a seed crystal
D1: diameter of an opening unit
D2: diameter of a blocking unit
D11: diameter of a pore
T1: thickness of a porous body
T2: thickness of a blocking unit

BEST MODE FOR CARRYING OUT THE INVENTION

Hereinafter, the invention will be described in detail with reference to the embodiments. The embodiments are not limited to those described below and may be modified into various forms as long as the gist of the invention is not altered.

Throughout the present specification, when a part is referred to as "comprising" an element, it is understood that other elements may be comprised, rather than other elements are excluded, unless specifically stated otherwise.

All numbers and expressions related to the quantities of components, reaction conditions, and the like used herein are to be understood as being modified by the term "about," unless otherwise indicated.

Process for Growing a Semi-Insulating Silicon Carbide Single Crystal Ingot (1)

Conventionally, in order to grow a SiC single crystal ingot, a method of loading a dopant to a porous graphite container or having a dopant contained in SIC through synthesis has been used. FIG. 2 shows a cross-sectional view of the conventional reaction vessel for growing a semi-insulating SiC single crystal ingot. FIG. 2 illustrates the structure of a reaction vessel in which a seed crystal (20) is mounted on the inner upper end, and SiC (10) and a porous graphite container (50) loaded with a dopant (40) are loaded in the inner lower region.

However, this conventional process has a disadvantage in that it is complicated and that the cost is increased. In addition, since it is difficult to control the doping concentration due to the impurities formed in the porous graphite container, the quality of the semi-insulating SiC single crystal ingot can be hardly enhanced.

In the process for growing a semi-insulating SiC single crystal ingot according to an embodiment, a SiC single crystal ingot is grown using a dopant coated with a carbon-based material, whereby it is possible to prevent the phenomenon that the dopant is sublimated before SiC. Thus, it is possible to minimize the non-uniformity of the doping concentration with respect to the thickness of the SiC single crystal ingot, thereby enhancing the quality of the semi-insulating SiC single crystal ingot.

In addition, it is possible to grow a semi-insulating SiC single crystal ingot through a simple process in which a dopant coated with a carbon-based material is used and to minimize the amount of the unreacted raw material, thereby reducing the cost.

Further, since the raw material is uniformly supplied by using a dopant coated with a carbon-based material, it is advantageous for enhancing the growth rate and quality of the SiC single crystal ingot, as well as for controlling the polymorphism. That is, if 4H—SiC is used, it is possible to lower the growth rate of 3C, 6H, and 15R while the growth rate of 4H is increased.

Thus, the process for growing a semi-insulated SiC single crystal ingot according to an embodiment may provide a semi-insulating SiC single crystal ingot with enhanced quality of the SIC single crystal ingot while imparting a semi-insulating state thereto.

FIG. 1 shows a cross-sectional view of the reaction vessel for growing a semi-insulating SiC single crystal ingot according to an embodiment. FIG. 1 illustrates the structure of a reaction vessel in which a seed crystal (20) is mounted on the inner upper end, and SiC (10) and a dopant (30) coated with a carbon-based material are loaded in the inner lower region.

The process for growing a semi-insulating SiC single crystal ingot according to an embodiment comprises (1) loading SiC (silicon carbide) and a dopant coated with a carbon-based material to a reaction vessel mounted with a seed crystal; and (2) growing a SiC single crystal ingot on the seed crystal.

First, in Order to Grow a SiC Single Crystal Ingot, SiC and a Dopant Coated with a Carbon-Based Material are Loaded to a Reaction Vessel Mounted with a Seed Crystal (Step (1)).

The reaction vessel may be a crucible and is made of a material having a melting point higher than the sublimation temperature of SiC. For example, it may be made of graphite, but it is not limited thereto.

The seed crystal may be mounted on the inner upper end of the reaction vessel. As the seed crystal, any seed crystal having various crystal structures such as 4H—SiC, 6H—SiC, 3C—SiC, and 15R—SiC may be used depending on the kind of crystals to be grown.

The SiC and the dopant coated with a carbon-based material may be loaded to the lower region of the reaction vessel.

According to an embodiment, the reaction vessel loaded with the SiC and the dopant coated with a carbon-based material may be sealed. After the reaction vessel is wrapped with one or more layers of a thermal insulation material, it is placed in a reaction chamber (e.g., a quartz tube) equipped with a heating means. The thermal insulation material and the reaction chamber serve to maintain the temperature of the reaction vessel at a temperature for growing a SiC single crystal.

The heating means may be induction heating means or resistance heating means. For example, a high-frequency induction coil through which high-frequency current flows may be used to heat the reaction vessel, thereby heating the SiC and the dopant coated with a carbon-based material to a desired temperature, but it is not limited thereto.

According to an embodiment, the SiC may be in the form of SiC powder. For example, the SiC may be in the form of SiC powder having a particle size of 10 μm to 5,000 μm. Specifically, the size of the SIC particles may be 50 μm to 3,000 μm, 50 μm to 2,000 μm, 100 μm to 2,000 μm, or 100 μm to 1,000 μm, but it is not limited thereto.

In an embodiment, the SiC may have a purity of 90% by weight to 99% by weight. Specifically, the SiC may have a purity of 91% by weight to 96% by weight or 92% by weight to 95% by weight, but it is not limited thereto.

According to an embodiment, the carbon-based material may be carbon black, graphite, or a combination thereof.

The dopant coated with a carbon-based material is prepared by drying; curing; carbonization or graphitization; and pulverization of a composition comprising a carbon-containing polymer resin, a solvent, and a dopant.

According to an embodiment, the carbon-containing polymer resin comprises at least one selected from the group consisting of phenolic resins, polyacrylamide resins, and thermosetting resins.

The phenolic resin may be one or more selected from the group consisting of novolac resins and resol resins, but it is not limited thereto.

The polyacrylamide resin may be a polyamic acid resin, but it is not limited thereto.

The thermosetting resin may be one or more selected from the group consisting of polyurethane resins, melamine resins, and alkyd resins, but it is not limited thereto.

The composition may comprise 1% by weight to 40% by weight of a carbon-containing polymer resin based on the total weight of the composition. For example, the composition may comprise a carbon-containing polymer resin in an amount of 5% by weight to 35% by weight, 5% by weight to 30% by weight, or 10% by weight to 30% by weight, based on the total weight of the composition, but it is not limited thereto.

According to an embodiment, the solvent may be one or more selected from the group consisting of ethanol, methanol, acetone, dimethylformamide, and dimethyl sulfoxide. Specifically, the solvent may be ethanol, but it is not limited thereto.

The composition may comprise 1% by weight to 20% by weight of a solvent based on the total weight of the composition. For example, the composition may comprise a solvent in an amount of 5% by weight to 17% by weight, 5% by weight to 15% by weight, or 10% by weight to 15% by weight, based on the total weight of the composition, but it is not limited thereto.

According to an embodiment, the dopant may be at least one selected from the group consisting of vanadium (V), chromium (Cr), manganese (Mn), and cobalt (Co). For example, the dopant may be a transition element (transition metal) and may be vanadium. Specifically, vanadium can form a deep energy level in any state of a donor or an acceptor in SiC crystals and compensates for the shallow donor or shallow acceptor impurities to make the crystals highly resistant, that is, to a semi-insulating state.

The composition may comprise 0.5% by weight to 10% by weight of a dopant based on the total weight of the composition. For example, the composition may comprise a dopant in an amount of 0.5% by weight to 8% by weight, 1% by weight to 8% by weight, or 1% by weight to 5% by weight, based on the total weight of the composition, but it is not limited thereto.

According to an embodiment, the drying may be carried out in a temperature range of 50° C. to 350° C. In addition, the curing may be carried out in a temperature range of 100° C. to 400° C. Specifically, when the above drying and curing conditions are satisfied, it may be advantageous for uniformly coating the carbon-based material on the dopant. For example, the drying may be carried out for 1 hour to 5 hours in a temperature range of 50° C. to 350° C. or 50° C. to 300° C., but it is not limited thereto. In addition, the curing may be carried out for 1 hour to 10 hours in a temperature range of 100° C. to 400° C. or 150° C. to 400° C., but it is not limited thereto.

According to an embodiment, the carbonization or graphitization is carried out in a temperature range of 200° C. to 2,200° C. and a pressure condition of 1 Torr to 1,500 Torr. Specifically, when the above carbonization or graphitization conditions are satisfied, it may be advantageous for coating the dopant with the carbon-based material. For example, the dopant subjected to the drying and curing steps is thermally treated in a temperature range of 300° C. to 600° C. and a pressure condition of 500 Torr to 700 Torr and then carbonized or graphitized in a temperature range of 2,000° C. to 2,200° C. and a pressure condition of 500 Torr to 800 Torr. In addition, the carbonization or graphitization may be carried out for 2 to 5 hours, but it is not limited thereto.

According to an embodiment, the carbonization or graphitization refers to thermal treatment in an inert atmosphere. The inert atmosphere may be a nitrogen atmosphere or an argon atmosphere, but it is not limited thereto.

According to an embodiment, the carbonized or graphitized dopant is subjected to a pulverization step.

The pulverization may be carried out by a method of a pulverization step using a top-down, a ball mill, a jet mill, and the like, but it is not limited thereto.

According to an embodiment, the particle size of the dopant coated with a carbon-based material may be 1 μm to 2,000 μm. For example, the particle size of the dopant coated with a carbon-based material may be 5 μm to 1,000 μm, 10 μm to 1,000 μm, or 10 μm to 500 μm, but it is not limited thereto.

According to an embodiment, the outer surface of the respective particles of the dopant, in part or in its entirety, may be coated with the carbon-based material. Specifically, the entire outer surface of the dopant, or 50% or more of the outer surface thereof, may be coated with the carbon-based material.

According to an embodiment, the coating thickness of the portion coated with a carbon-based material is 1 μm to 100 μm. Specifically, when the coating thickness of the portion coated with a carbon-based material satisfies the above thickness range, the doping concentration of the dopant at the initial, intermediate, and final stages may be made uniform in the step of growing the SiC single crystal ingot. For example, the coating thickness of the portion coated with a carbon-based material may be 5 μm to 50 μm, 5 μm to 40 μm, 10 μm to 40 μm, 10 μm to 30 μm, or 10 μm to 25 μm, but it is not limited thereto.

Next, a SiC Single Crystal Ingot is Grown on the Seed Crystal (Step (2)).

According to an embodiment, the step of growing a SiC single crystal ingot on the seed crystal in step (2) is a step of sublimating the SiC and the dopant coated with a carbon-based material loaded in step (1) to grow on the seed crystal.

The sublimation point of the SiC is 2,000° C. to 2,800° C. In addition, the sublimation point of the dopant is 1,800'C to 2,000° C., and the sublimation point of the dopant coated with a carbon-based material is 2,000° C. to 2,500° C.

Specifically, when the sublimation point of the dopant coated with a carbon-based material satisfies the above range, the dopant may be sublimated within a temperature range similar to that of SiC. For example, the sublimation point of the dopant coated with a carbon-based material may be 2,100° C. to 2,500° C. or 2,100° C. to 2,300° C., but it is not limited thereto.

According to an embodiment, the temperature in step (2) may be 2,000° C. to 2,500° C., 2,200° C. to 2,500° C., or 2,250° C. to 2,300° C., but it is not limited thereto. In addition, the pressure in step (2) may be 1 Torr to 150 Torr, 1 Torr to 100 Torr, or 1 Torr to 50 Torr, but it is not limited thereto.

According to an embodiment, the SiC single crystal ingot may have a resistivity of 0.1 Ωcm to $1\times10^{10}$ Ωcm. For example, the SiC single crystal ingot may have a resistivity of 0.1 Ωcm to $1\times10^5$ Ωcm, 1 Ωcm to $1\times10^8$ Ωcm, or 10 Ωcm to $1\times10^5$ Ωcm, but it is not limited thereto.

According to an embodiment, the dopant concentration of the SiC single crystal ingot is $5.5\times10^{16}$ atoms/cc to $1\times10^{18}$ atoms/cc. Specifically, the dopant concentration of the SiC single crystal ingot may be $5.5\times10^{16}$ atoms/cc to $1.5\times10^{17}$ atoms/cc or $1\times10^{17}$ atoms/cc to $5\times10^{17}$ atoms/cc.

According to an embodiment, the SiC single crystal ingot has a purity of 95% to 99.9%. For example, the SiC single crystal ingot may have a purity of 95% to 99.5%, 97% to 99.5%, 98% to 99.5%, 98% to 99%, but it is not limited thereto.

Process for Growing a Semi-Insulating Silicon Carbide Single Crystal Ingot (2)

Conventionally, in order to grow a SiC single crystal ingot, a method of loading a dopant to a porous graphite container or having a dopant contained in SiC through synthesis has been used. FIG. 2 shows a cross-sectional view of the conventional reaction vessel for growing a semi-insulating SiC single crystal ingot. FIG. 2 illustrates the structure of a reaction vessel in which a seed crystal (20) is mounted on the inner upper end, and SiC (10) and a porous graphite container (50) loaded with a dopant (40) are loaded in the inner lower region.

However, this conventional process has a disadvantage in that it is complicated and that the cost is increased. Since it is difficult to control the doping concentration due to the impurities formed in the porous graphite container, the quality of the semi-insulating SiC single crystal ingot can be hardly enhanced. In addition, in order to solve the above problems, SiC and a dopant have been pulverized, or those having a large particle size have been used. However, this process has a disadvantage in that a separate thermal treatment step for the powder is required.

In the process for growing a semi-insulating SiC single crystal ingot according to an embodiment, a composition comprising a carbon-containing polymer resin, a solvent, a dopant, and SiC is solidified, and a SiC single crystal ingot is then grown, whereby it is possible to prevent the phenomenon that the dopant is sublimated before SiC. Thus, it is possible to minimize the non-uniformity of the doping concentration with respect to the thickness of the SiC single crystal ingot, thereby enhancing the quality of the semi-insulating SiC single crystal ingot.

In addition, according to the process for growing a semi-insulating SiC single crystal ingot according to the embodiment, it is possible to suppress unintended mixing of impurities, to readily control the doping, to readily adjust the doping content, and to prevent agglomeration in some regions.

Thus, the process for growing a semi-insulated SiC single crystal ingot according to an embodiment may provide a semi-insulating SiC single crystal ingot with enhanced quality of the SiC single crystal ingot while imparting a semi-insulating state thereto.

Further, since the raw material is uniformly supplied, it is advantageous for enhancing the growth rate and quality of the SiC single crystal ingot, as well as for controlling the polymorphism. That is, if 4H—SiC is used, it is possible to lower the growth rate of 3C, 6H, and 15R while the growth rate of 4H is increased.

FIG. 13 shows a cross-sectional view of the reaction vessel for growing a semi-insulating SiC single crystal ingot according to an embodiment. FIG. 13 illustrates the structure of a reaction vessel in which a seed crystal (20) is mounted on the inner upper end, and a solidified composition (60) is loaded in the inner lower region.

The process for growing a SiC single crystal ingot according to an embodiment comprises (a) loading a composition comprising a carbon-containing polymer resin, a solvent, a dopant, and SiC (silicon carbide) to a reaction vessel; (b) solidifying the composition; and (c) growing a SiC single crystal ingot on the seed crystal provided in the reaction vessel.

First, a Composition Comprising a Carbon-Containing Polymer Resin, a Solvent, a Dopant, and SiC (Silicon Carbide) is Loaded to a Reaction Vessel (Step (a)).

The reaction vessel may be a crucible and is made of a material having a melting point higher than the sublimation temperature of SiC. For example, it may be made of graphite, but it is not limited thereto.

The composition may be loaded to the inner lower region of the reaction vessel.

According to an embodiment, the reaction vessel loaded with the composition may be sealed. After the reaction vessel is wrapped with one or more layers of a thermal insulation material, it is placed in a reaction chamber (e.g., a quartz tube) equipped with a heating means. The thermal insulation material and the reaction chamber serve to maintain the temperature of the reaction vessel at a temperature for growing a SiC single crystal.

The heating means may be an induction heating means or a resistance heating means. For example, a high-frequency induction coil through which high-frequency current flows may be used to heat the reaction vessel, thereby heating the composition to a desired temperature, but it is not limited thereto.

The details of the carbon-containing polymer resin are the same as described in step (1) above.

The composition may comprise 1% by weight to 40% by weight of a carbon-containing polymer resin based on the total weight of the composition. For example, the composition may comprise a carbon-containing polymer resin in an amount of 5% by weight to 35% by weight, 5% by weight to 30% by weight, or 10% by weight to 30% by weight, based on the total weight of the composition, but it is not limited thereto.

The details of the solvent are the same as described in step (1) above.

According to an embodiment, the dopant may be at least one selected from the group consisting of vanadium (V), chromium (Cr), manganese (Mn), and cobalt (Co). For example, the dopant may be a transition metal and may be vanadium. Specifically, vanadium can form a deep level in any state of a donor or an acceptor in SiC crystals and compensates for the shallow donor or shallow acceptor impurities to make the crystals high resistance, that is, to a semi-insulating state.

The composition may comprise 1% by weight to 20% by weight of a dopant based on the total weight of the composition. For example, the composition may comprise a dopant in an amount of 5% by weight to 17% by weight, 5% by weight to 15% by weight, or 10% by weight to 15% by weight, based on the total weight of the composition, but it is not limited thereto.

The details of the SiC are the same as described in step (1) above.

Next, in Order to Grow a SiC Single Crystal Ingot. The Composition is Solidified (Step b)).

Specifically, the solidification in step (b) undergoes drying; curing; and carbonization or graphitization of the composition.

According to an embodiment, the drying may be carried out in a temperature range of 50° C. to 350° C. In addition, the curing may be carried out in a temperature range of 100° C. to 400° C. Specifically, when the drying and curing conditions are satisfied, it may be advantageous for carbonization or graphitization of the composition. For example, the drying may be carried out for 1 hour to 5 hours in a temperature range of 50° C. to 350° C. or 50° C. to 300° C., but it is not limited thereto. In addition, the curing may be carried out for 1 hour to 10 hours in a temperature range of 100° C. to 400° C. or 150° C. to 400° C., but it is not limited thereto.

According to an embodiment, the carbonization or graphitization is carried out in a temperature range of 200° C. to 2,200° C. and a pressure condition of 1 Torr to 1,500 Torr. Specifically, when the temperature and pressure conditions are satisfied, it may be advantageous for carbonization or graphitization of the composition. For example, the dopant subjected to the drying and curing steps is thermally treated in a temperature range of 300° C. to 600° C. and a pressure condition of 500 Torr to 700 Torr and then carbonized or graphitized in a temperature range of 2,000° C. to 2,200° C. and a pressure condition of 500 Torr to 800 Torr. In addition, the carbonization or graphitization may be carried out for 2 to 5 hours, but it is not limited thereto.

According to an embodiment, the carbonization or graphitization refers to thermal treatment in an inert atmosphere. The inert atmosphere may be a nitrogen atmosphere or an argon atmosphere, but it is not limited thereto.

According to an embodiment, the composition subjected to step (b) is a solid that fills the entire inner bottom side and a part of the inner wall side of the reaction vessel. In such case, in the growth of a SiC single crystal ingot, it is possible to prevent SiC from bouncing and adhering to the seed crystal due to the thermal vibration or from interfering with the formation of the SiC flux pattern. In addition, it is possible to suppress unintended mixing of impurities and to prevent agglomeration in some regions.

According to another embodiment, the composition subjected to step (b) may be a pellet-shaped solid.

According to still another embodiment, the process may further comprise (a') loading a pellet-shaped mold to the reaction vessel prior to step (a). The pellet shape prepared from the pellet-shaped mold may be a cylindrical or polygonal column shape. For example, it may be a geometric shape such as circle, triangle, square, pentagon, hexagon, octagon, or star, but it is not limited thereto.

The composition solidified through steps (a'), (a), and (b) is separated from the pellet-shaped mold to thereby obtain a pellet-shaped solid. Since the composition for preparing a SiC single crystal ingot can be prepared in a pellet-shaped solid, it is possible to enhance the storage convenience as well as thermal resistance and moisture resistance.

According to another embodiment, SiC is loaded to the lower region of the reaction vessel, and a pellet-shaped solid may then be loaded to a desired position. Specifically, the pellet-shaped solid may be loaded like the conventional porous graphite container that used to be loaded to the lower region of the reaction vessel as in FIG. 2. Thus, the pellet-shaped solid has advantages in that it is easy to control doping, it can be used freely regardless of the structure of the reaction vessel, it is easy to store, and it is possible to enhance the thermal resistance and moisture resistance.

According to an embodiment, a SiC single crystal ingot is not grown in step (b).

Next, a SiC Single Crystal Ingot is Grown on the Seed Crystal Provided in the Reaction Vessel (Step (C)).

The seed crystal may be mounted on the inner upper end of the reaction vessel. As the seed crystal, any seed crystal having various crystal structures such as 4H—SiC, 6H—SiC, 3C—SiC, and 15R—SiC may be used depending on the kind of crystals to be grown.

According to an embodiment, the step of growing a SiC single crystal ingot on the seed crystal is a step of sublimating the composition subjected to step (b) to grow on the seed crystal.

The sublimation point of the composition in step (c) is 2,000° C. to 2,500° C. Specifically, when the sublimation point of the composition satisfies the above temperature range, the dopant may be sublimated within a temperature range similar to that of SiC. For example, the sublimation point of the composition may be 2,100° C. to 2,500° C. or 2,100° C. to 2,300° C., but it is not limited thereto.

According to an embodiment, the temperature in step (b) may be 2,000° C. to 2,500° C., 2,200° C. to 2,500° C., or 2,250° C. to 2,300° C., but it is not limited thereto. In addition, the pressure in step (b) may be 1 Torr to 150 Torr, 1 Torr to 100 Torr, or 1 Torr to 50 Torr, but it is not limited thereto.

The details of the resistivity, dopant concentration, and purity of the SiC single crystal ingot are the same as described in step (2) above.

Apparatus for Growing a Silicon Carbide Single Crystal Ingot

Conventionally, in order to grow a SiC single crystal ingot, a method of loading a dopant to a porous graphite container or having a dopant contained in SIC through synthesis has been used.

FIG. 21 shows a cross-sectional view of the conventional apparatus for growing a SiC single crystal ingot. Specifically, FIG. 21 illustrates an apparatus for growing a SiC single crystal ingot in which a reaction vessel cap (700') is formed on the inner upper end of a reaction vessel (200'), a seed crystal (100') is fixed to the lower end of the reaction vessel cap (700'), an ingot growing unit (300') and a raw material receiving unit (400') are formed in the upper and lower regions of the reaction vessel, respectively, and a porous graphite container (800') to which a dopant has been loaded is formed in the raw material receiving unit (400').

However, this conventional process has a disadvantage in that it is complicated and that the cost is increased. Since it is difficult to control the doping concentration due to the impurities formed in the porous graphite container, the quality of the SiC single crystal ingot can be hardly enhanced. In addition, in order to solve the above problems, SiC and a dopant have been pulverized, or those having a large particle size have been used. However, this process has a disadvantage in that a separate thermal treatment step for the powder is required.

Further, the size of the reaction vessel (200') in the conventional apparatus for growing a SiC single crystal ingot is increased in order to grow a SiC single crystal ingot having a large diameter, which requires a large amount of energy to heat the SiC single crystal ingot to a temperature for growing it to a large diameter. Further, there is a disadvantage in that the temperature gradient is not uniform since heat is not well transferred to the center of the ingot growing unit (300') where the ingot is grown and that the quality of the ingot is deteriorated.

FIG. 20 shows a cross-sectional view of the apparatus for growing a SIC single crystal ingot according to an embodiment. FIG. 20 illustrates an apparatus for growing a SiC single crystal ingot in which a reaction vessel cap (700) is formed on the inner upper end of a reaction vessel (200), a seed crystal (100) is fixed to the lower end of the reaction vessel cap (700), a filter unit (500) that comprises an opening unit (510) forming the inner center of the reaction vessel and a porous body (520) surrounding the opening unit is formed in the lower region of the reaction vessel, a raw material receiving unit (400) is formed between the porous body and the inner wall of the reaction vessel, and a blocking unit (600) is formed at the upper end of the raw material receiving unit and at the upper end of the porous body.

According to the apparatus for growing a SiC single crystal ingot according to an embodiment, the raw material receiving unit (400) is formed between the porous body (520) and the inner wall of the reaction vessel. It is economical since it is possible to reduce the amount of energy required to grow a SiC single crystal ingot.

In addition, the apparatus for growing a SiC single crystal ingot according to an embodiment is suitable for preparing a SiC single crystal ingot having a large diameter.

Further, in the apparatus for growing a SiC single crystal ingot according to an embodiment, the porous body (520) is prepared through carbonization or graphitization of a SiC composition comprising a carbon-containing polymer resin, a SiC, a dopant, and a solvent and comprises a pore (523), a flowing path (524), and a pore wall (525), and the blocking unit (600) is formed at the upper end of the raw material receiving unit (400) and at the upper end of the porous body (520). Thus, even when heat is applied to the reaction vessel (200), the dopant is not sublimated first as compared with SiC. Specifically, when heat is applied to the reaction vessel (200), the SIC in a solid state in the raw material receiving unit (400) is sublimated into a gas, which moves to the opening unit (510) through the porous body (520), and is then sublimated to a solid in the lower region of the ingot growing unit (300), so that a SiC single crystal ingot is grown.

Thus, the apparatus for growing a SIC single crystal ingot according to an embodiment can minimize the amount of the unreacted raw material, thereby reducing the cost.

In addition, according to the apparatus for growing a SIC single crystal ingot according to an embodiment, it is possible to minimize the non-uniformity of the temperature gradient in the ingot growing unit, thereby preparing a SiC single crystal ingot with enhanced shape, growth rate, and quality. Specifically, if the temperature gradient in the ingot growing unit (300) is not uniform, the SiC single crystal ingot may be grown in a convex shape. However, since the temperature gradient in the ingot growing unit (300) in the apparatus for growing a SiC single crystal ingot according to an embodiment is uniform, the SiC single crystal ingot may be grown in a flat shape.

Further, since the raw material is uniformly supplied by the uniform temperature gradient, it is advantageous for enhancing the growth rate and quality of the SiC single crystal ingot, as well as for controlling the polymorphism. That is, if 4H—SiC is used, it is possible to suppress the growth of such polymorphs as 3C, 6H, and 15R while the growth stability of 4H is increased.

Further, according to the apparatus for growing a SiC single crystal ingot according to an embodiment, it is possible to suppress unintended mixing of impurities and to readily control the doping.

The apparatus for growing a SiC single crystal ingot according to an embodiment comprises a seed crystal (100) and a reaction vessel (200), wherein the reaction vessel (200) comprises an ingot growing unit (300), a filter unit (500), a raw material receiving unit (400), and a blocking unit (600), and the filter unit (500) comprises an opening unit (510) and a porous body (520).

Specifically, the apparatus for growing a SiC single crystal ingot according to an embodiment comprises a seed crystal (100) having a predetermined diameter; and a reaction vessel (200) for growing an ingot on the surface of the seed crystal while the seed crystal is fixed therein, wherein the reaction vessel (200) comprises an ingot growing unit (300) that forms at least a part of the upper region of the reaction vessel and that fixes the seed crystal at the upper end; a filter unit (500) that comprises an opening unit (510) forming the inner center of the reaction vessel and a porous body (520) surrounding the opening unit and that forms at least a part of the lower region of the reaction vessel while being located under the seed crystal; a raw material receiving unit (400) that is located between the porous body and the inner wall of the reaction vessel, that forms at least a part of the lower region of the reaction vessel, and that receives the raw material of the ingot therein; and a blocking unit (600) that is positioned at the upper end of the raw material receiving unit and at the upper end of the porous body.

In addition, the apparatus for growing a SiC single crystal ingot according to another embodiment further comprises a reaction vessel cap (700) formed on the inner upper end of the reaction vessel (200), wherein the seed crystal may be fixed to the lower end of the reaction vessel cap.

Seed Crystal (100)

According to an embodiment, the seed crystal (100) may be fixed to the inner upper end of the reaction vessel (200). Specifically, the seed crystal (100) may be fixed to the lower end of the reaction vessel cap (700).

In addition, as the seed crystal (100), any seed crystal (100) having various crystal structures such as 4H—SiC, 6H—SiC, 3C—SiC, and 15R—SiC may be used depending on the kind of crystals to be grown.

According to an embodiment, the diameter (a) of the seed crystal is 4 inches or more. Specifically, the diameter (a) of the seed crystal may be 4 inches to 50 inches. More specifically, the diameter (a) of the seed crystal may be 4 inches to 30 inches, 4 inches to inches, 4 inches to 15 inches, 4 inches to 10 inches, or 4 inches to 8 inches, but it is not limited thereto.

According to an embodiment, the diameter of the SiC single crystal ingot grown on the lower end of the seed crystal (100) may be 4 inches or more or 6 inches or more. Specifically, the diameter of the SiC single crystal ingot grown on the lower end of the seed crystal (100) may be 4 inches to 55 inches, 4 inches to 35 inches, 4 inches to 25 inches, 4 inches to 15 inches, 6 inches to 55 inches, 6 inches to 35 inches, 6 inches to 20 inches, 6 inches to 15 inches or 4 inches to 8 inches, but it is not limited thereto.

According to another embodiment, the diameter of the SiC single crystal ingot grown on the lower end of the seed crystal (100) may be equal to, or greater than, the diameter (a) of the seed crystal.

Reaction Vessel (200)

The reaction vessel (200) may be a crucible and is made of a material having a melting point a sublimation temperature of 2,600° C. to 3,000° C. For example, it may be made of graphite, but it is not limited thereto.

In an embodiment, the reaction vessel (200) may have an inner space and may have a shape in which its top is open.

The apparatus for growing a SiC single crystal ingot according to an embodiment may further comprise a thermal insulation material that wraps the reaction vessel (200).

According to another embodiment, the reaction vessel loaded with the materials for the ingot may be sealed. After the reaction vessel (200) is wrapped with one or more layers of a thermal insulation material, it is placed in a reaction chamber (e.g., a quartz tube) equipped with a heating means. The thermal insulation material and the reaction chamber serve to maintain the temperature of the reaction vessel (200) at a temperature for growing a SiC single crystal.

The heating means may be an induction heating means or a resistance heating means. For example, a high-frequency induction coil through which high-frequency current flows may be used to heat the reaction vessel (200), thereby heating the raw material to a desired temperature, but it is not limited thereto.

Ingot Growing Unit (300) and Raw Material Receiving Unit (400)

According to an embodiment, the reaction vessel (200) comprises an ingot growing unit (300) that forms at least a part of the upper region of the reaction vessel and that fixes the seed crystal (100) at the upper end.

Specifically, when heat is applied to the reaction vessel (200), the SiC in a solid state contained in the raw material receiving unit (400) is sublimated into a gas, which moves to the opening unit (510) through the porous body (520), and is then sublimated to a solid in the lower region of the ingot growing unit (300), so that a SiC single crystal ingot is grown.

According to another embodiment, the reaction vessel (200) comprises a raw material receiving unit (400) that is located between the porous body (520) and the inner wall of the reaction vessel, that forms at least a part of the lower region of the reaction vessel, and that receives the raw material of the ingot therein.

According to an embodiment, the raw material is SiC powder, and the average diameter of the powder particles may be 10 μm to 5,000 μm. For example, the size of the SiC particles may be 50 μm to 3,000 μm or 100 μm to 1,000 μm, but it is not limited thereto.

In an embodiment, the SiC may have a purity of 90% by weight to 99% by weight. Specifically, the SiC may have a purity of 91% by weight to 97% by weight or 93% by weight to 95% by weight, but it is not limited thereto.

Filter Unit (500)

According to an embodiment, the filter unit (500) comprises an opening unit (510) and a porous body (520) surrounding the opening unit.

Specifically, the reaction vessel (200) comprises a filter unit (500) that comprises an opening unit (510) forming the inner center of the reaction vessel and a porous body (520) surrounding the opening unit (510) and that forms at least a part of the lower region of the reaction vessel while being located under the seed crystal (100).

According to an embodiment, the filter unit (500) may form the inner center of the reaction vessel (200).

In an embodiment, the filter unit (500) may be a cylindrical or polygonal column shape. For example, the cross-section of the filter unit (500) may be a geometric shape such as circle, triangle, square, pentagon, hexagon, octagon, or star, but it is not limited thereto.

FIG. 22 shows a filter unit (500) of the apparatus for growing a SiC single crystal ingot according to an embodiment. FIG. 22 illustrates a filter unit (500) having a cylindrical shape in which an opening unit (510) is formed therein and a porous body (520) is formed to surround the opening unit (510).

FIG. 23 shows another filter unit of the apparatus for growing a SiC single crystal ingot according to an embodiment. FIG. 23 illustrates a filter unit (500) having a square column shape in which an opening unit (510) is formed therein and a porous body (520) is formed to surround the opening unit (510).

In an embodiment, the porous body (520) may be prepared from a SiC composition comprising a carbon-containing polymer resin, SiC, a dopant, and a solvent.

The carbon-containing polymer resin may comprise at least one selected from the group consisting of phenolic resins, polyacrylamide resins, and thermosetting resins.

The phenolic resin may be one or more selected from the group consisting of novolac resins and resol resins, but it is not limited thereto.

The polyacrylamide resin may be a polyamic acid resin, but it is not limited thereto.

The thermosetting resin may be one or more selected from the group consisting of polyurethane resins, melamine resins, and alkyd resins, but it is not limited thereto.

The SiC is in a powder form, and the average diameter of the powder particles may be 10 μm to 5,000 μm. For example, the size of the SiC particles may be 50 μm to 3,000 μm or 100 μm to 1,000 μm, but it is not limited thereto.

In an embodiment, the SiC may have a purity of 90% by weight to 99% by weight. Specifically, the SiC may have a purity of 91% by weight to 97% by weight or 93% by weight to 95% by weight, but it is not limited thereto.

The dopant may comprise at least one selected from the group consisting of vanadium (V), chromium (Cr), manganese (Mn), and cobalt (Co). For example, the dopant may be a transition metal. Specifically, it may be vanadium. For example, vanadium can form a deep level in any state of a donor or an acceptor in SiC crystals and compensates for the shallow donor or shallow acceptor impurities to make the crystals highly resistant, that is, to a semi-insulating state.

The SiC composition may comprise 1% by weight to 20% by weight of a dopant based on the total weight of the SiC composition. For example, the SiC composition may comprise a dopant in an amount of 5% by weight to 17% by weight, 5% by weight to 15% by weight, or 10% by weight to 15% by weight, based on the total weight of the SiC composition, but it is not limited thereto.

According to an embodiment, the solvent may be one or more selected from the group consisting of ethanol, methanol, acetone, dimethylformamide, and dimethyl sulfoxide. Specifically, the solvent may be ethanol, but it is not limited thereto.

The SiC composition may comprise 1% by weight to 20% by weight of a solvent based on the total weight of the SiC composition. For example, the SiC composition may comprise a solvent in an amount of 5% by weight to 17% by weight, 5% by weight to 15% by weight, or 10% by weight to 15% by weight, based on the total weight of the SiC composition, but it is not limited thereto.

The SiC composition may comprise 1% by weight to 40% by weight of a carbon-containing polymer resin based on the total weight of the SiC composition. For example, the SiC composition may comprise a carbon-containing polymer resin in an amount of 5% by weight to 35% by weight, 5% by weight to 30% by weight, or 10% by weight to 30% by weight, based on the total weight of the SiC composition, but it is not limited thereto.

According to an embodiment, the solvent may be one or more selected from the group consisting of ethanol, methanol, acetone, dimethylformamide, and dimethyl sulfoxide. Specifically, the solvent may be ethanol, but it is not limited thereto.

The SiC composition may comprise 1% by weight to 20% by weight of a solvent based on the total weight of the SiC composition. For example, the SiC composition may comprise a solvent in an amount of 5% by weight to 17% by weight, 5% by weight to 15% by weight, or 10% by weight to 15% by weight, based on the total weight of the SiC composition, but it is not limited thereto.

In an embodiment, the porous body is prepared through carbonization or graphitization of the SiC composition.

Specifically, the porous body may be prepared by subjecting the SiC composition to drying; curing; and carbonization or graphitization.

According to an embodiment, the drying may be carried out in a temperature range of 30° C. to 400° C. or 50° C. to 350° C. In addition, the curing may be carried out in a temperature range of 30'C to 400° C. or 100° C. to 400° C. When the drying and curing conditions are satisfied, it may be advantageous for carbonization or graphitization of the SIC composition.

For example, the drying may be carried out for 1 hour to 5 hours in a temperature range of 30° C. to 400° C., 50° C. to 350° C., or 50° C. to 300° C., but it is not limited thereto. In addition, the curing may be carried out for 1 hour to 10 hours in a temperature range of 30° C. to 400° C., 100° C. to 400° C., or 150° C. to 400° C., but it is not limited thereto.

According to an embodiment, the carbonization or graphitization is carried out in a temperature range of 200° C. to 2,200° C. and a pressure condition of 1 Torr to 1,500 Torr. When the temperature and pressure conditions are satisfied, it may be advantageous for carbonization or graphitization of the SiC composition.

For example, the SiC composition subjected to the drying and curing steps is thermally treated in a temperature range of 300° C. to 600° C. and a pressure condition of 500 Torr to 700 Torr and then carbonized or graphitized in a temperature range of 2,000° C. to 2,200° C. and a pressure condition of 500 Torr to 800 Torr. In addition, the carbonization or graphitization may be carried out for 1 to 5 hours or 2 to 5 hours, but it is not limited thereto.

According to an embodiment, the carbonization or graphitization refers to thermal treatment in an inert atmosphere. The inert atmosphere may be a nitrogen atmosphere or an argon atmosphere, but it is not limited thereto.

In an embodiment, the porous body (520) may comprise a pore (523), a flowing path (524), and a pore wall (525). Specifically, as the porous body (520) comprises a pore (523), a flowing path (524), and a pore wall (525), the raw material reacted with the dopant can move uniformly, and the C/Si ratio is increased as compared with the prior art, so that the stability of polymorphs can be enhanced.

In an embodiment, the diameter (D11) of the pore may be in the range of 1 μm to 500 μm. For example, it may be 10 μm to 400 μm, 25 μm to 300 μm, 50 μm to 200 μm, or 75 μm to 100 μm, but it is not limited thereto.

In another embodiment, the specific surface area of the porous body may be 1,000 m$^2$/g to 4,000 m$^2$/g. For example, it may be 1,200 m$^2$/g to 3,500 m$^2$/g, 1,300 m$^2$/g to 3,000 m$^2$/g, 1,400 m$^2$/g to 2,500 m$^2$/g, or 1,500 m$^2$/g to 2,000 m$^2$/g, but it is not limited thereto.

In an embodiment, the porous body (520) may comprise an outer circumferential surface (522) and an inner circumferential surface (521). The thickness (T1) of the porous body refers to an average thickness between the outer circumferential surface (522) and the inner circumferential surface (521) of the porous body.

In an embodiment, the thickness (T1) of the porous body may be 5 mm to 20 mm. For example, it may be 7 mm to 20 mm, 7 mm to 18 mm, 10 mm to 18 mm, or 10 mm to 16 mm, but it is not limited thereto.

In an embodiment, the diameter (D1) of the opening unit may be 15% to 40% of the diameter (a) of the seed crystal. For example, the diameter (D1) of the opening unit may be 15% to 35%, 17% to 35%, 17% to 33%, 20% to 33%, 20% to 30%, 23% to 30%, or 25% to 30% of the diameter (a) of the seed crystal, but it is not limited thereto. In addition, if the opening unit has a polygonal column shape, the diameter of the opening unit having a polygonal column shape refers to a diameter of a circle having the same area as that of the polygon.

Blocking Unit (600)

According to an embodiment, the reaction vessel (200) comprises a blocking unit (600) located at the upper end of the raw material receiving unit (400) and at the upper end of the porous body (520).

As the blocking unit (600) is located at the upper end of the raw material receiving unit (400) and at the upper end of the porous body (520), it is possible to minimize the amount of the unreacted raw material, thereby reducing the cost. In addition, it is possible to suppress unintended mixing of impurities and to readily control the doping.

FIG. 24 shows a blocking unit (600) of the apparatus for growing a SiC single crystal ingot according to an embodiment. FIG. 24 illustrates a blocking unit (600) having an inner space.

In an embodiment, the diameter (D1) of the opening unit is greater than, or equal to, the inner diameter (D2) of the blocking unit.

In an embodiment, the ratio of the diameter (D1) of the opening unit and the inner diameter (D2) of the blocking unit may be 1:0.8 to 1:1. For example, it may be 1:0.9 or 1:1, but it is not limited thereto.

In an embodiment, the blocking unit (600) may comprise at least one selected from the group consisting of graphite, tantalum (Ta), tantalum carbide (TaC), tungsten (W), and tungsten carbide (WC).

In an embodiment, the thickness (T2) of the blocking unit may be 1 mm to 10 mm. For example, it may be 3 mm to 10 mm, 3 mm to 8 mm, or 5 mm to 8 mm, but it is not limited thereto.

Reaction Vessel Cap (700)

The apparatus for growing a SiC single crystal ingot according to an embodiment further comprises a reaction vessel cap (700) located at the inner upper end of the reaction vessel (200), wherein the seed crystal (100) is fixed to the lower end of the reaction vessel cap (700).

The details of the resistivity and purity of the SiC single crystal ingot are the same as described in step (2) above.

According to an embodiment, the dopant concentration of the SiC single crystal ingot prepared by the apparatus for growing a SiC single crystal ingot is $1\times10^{15}$ atoms/cc to $5\times10^{17}$ atoms/cc. Specifically, the dopant concentration of the SiC single crystal ingot may be $5\times10^{15}$ atoms/cc to $1\times10^{17}$ atoms/cc or $1\times10^{16}$ atoms/cc to $5\times10^{16}$ atoms/cc, but it is not limited thereto.

Mode for Carrying Out the Invention

Hereinafter, the present invention will be described in detail with reference to examples. The following examples are only illustrative of the present invention, and the scope of the present invention is not limited thereto.

Example 1

80% by weight of a phenolic resin (product name: KC-5536, manufacturer: Kangnam Chemical) as a carbon-containing polymer resin, 18% by weight of an ethanol solvent (manufacturer: OCI), and 2% by weight of a vanadium dopant were mixed. It was dried at 200° C. for 3 hours and then cured at 400° C. for 2 hours. It was thermally treated under the conditions of 500° C. and 700 Torr, carbonized or graphitized for 5 hours under the conditions of 2,000° C. and 760 Torr, and then pulverized to prepare a dopant coated with a carbon-based material and having an average particle size of 10 μm.

A seed crystal was mounted on the inner upper end of a graphite crucible, and SiC powder and the dopant coated with a carbon-based material were then loaded. The crucible was wrapped with a thermal insulation material and placed in a reaction chamber provided with a heating coil. The inside of the crucible was vacuumed, and argon gas was slowly charged thereto. In addition, the temperature in the crucible was raised to 2,400° C., and the pressure was raised to 700 Torr. Thereafter, the pressure was gradually lowered to reach 30 Torr, and a SiC single crystal ingot was grown on the seed crystal for 50 hours under these conditions to prepare a semi-insulating SiC single crystal ingot.

Comparative Example 1

A semi-insulating SiC single crystal ingot was prepared in the same manner as in the above Example, except that a porous graphite container loaded with a dopant was used instead of the dopant coated with a carbon-based material.

Evaluation Example 1-1: Measurement of Dopant Concentration

The semi-insulating SiC single crystal ingots prepared in Example 1 and Comparative Example 1 were measured for the concentration of the dopant using SIMS (secondary ion mass spectrometry). The results are shown in Table 1 below.

TABLE 1

|  | Dopant concentration (atoms/cc) |
| --- | --- |
| Example 1 | $1.1 \times 10^{17}$ |
| Comparative Example 1 | $5.3 \times 10^{16}$ |

As shown in Table 1 above, the concentration of the dopant of the semi-insulating SiC single crystal ingot prepared according to Example 1 was greater than the concentration of the dopant of the semi-insulating SiC single crystal ingot prepared according to Comparative Example 1.

Evaluation Example 1-2: Evaluation of Surface Image

The surface images of the semi-insulating SiC single crystal ingots prepared in Example 1 and Comparative Example 1 were evaluated with the naked eyes using an optical microscope.

FIG. 3 shows a surface image of the semi-insulating SiC single crystal ingot of Example 1. FIG. 4 shows a surface image of the semi-insulating SiC single crystal ingot of Comparative Example 1.

As shown in FIG. 3, in the semi-insulating SiC single crystal ingot prepared according to Example 1, the dopant concentration was maintained uniformly in the step of growing the SiC single crystal ingot, so that the dopant was rarely precipitated. In contrast, as shown in FIG. 4, in the semi-insulating SiC single crystal ingot of Comparative Example 1, excessive doping was taken place in the step of growing the SiC single crystal ingot, whereby the dopant was precipitated.

Evaluation Example 1-3: Change in the Doping Concentration in the Growing Step

For the semi-insulating SIC single crystal ingots prepared in Example 1 and Comparative Example 1, the change in doping concentration images at the initial, intermediate, and final stages in the growth of the SiC single crystal ingot on the seed crystal was evaluated using the substrate processing.

FIGS. 5 to 7 show the doping concentration at the initial, intermediate, and final stages in the growth of the semi-insulating SiC single crystal ingot of Example 1. FIGS. 8 to 10 show the doping concentration at the initial, intermediate, and final stages in the growth of the semi-insulating SiC single crystal ingot of Comparative Example 1.

As shown in FIGS. 5 to 7, the semi-insulating SiC single crystal ingot prepared according to Example 1 was uniformly transparent through the entire substrate. In contrast, as shown in FIGS. 8 to 10, the semi-insulating SiC single crystal ingot prepared according to Comparative Example 1 had a partially dark color and a non-uniform color distribution.

Evaluation Example 1-4: Evaluation of Ingot Surface and UV Image

The UV images of the semi-insulating SiC single crystal ingots prepared in Example 1 and Comparative Example 1 were evaluated with the naked eyes using UV lamp irradiation.

FIG. 11 shows a UV image of the semi-insulating SiC single crystal ingot of Example 1. FIG. 12 shows a UV image of the semi-insulating SiC single crystal ingot of Comparative Example 1.

The UV images of FIGS. 11 and 12 confirm the control of polymorphs. Specifically, green represents 4H, red represents 6H, and black represents 15R. As shown in FIG. 11, in the semi-insulating SiC single crystal ingot prepared according to Example 1, the desired 4H was uniformly formed. In contrast, as shown in FIG. 12, in the semi-insulating SiC single crystal ingot prepared according to Comparative Example 1, 4H, 6H, and 15R were partially formed, resulting in a poor quality of the SiC single crystal ingot.

Example 2

80% by weight of a phenolic resin (product name: KC-5536, manufacturer: Kangnam Chemical) as a carbon-containing polymer resin, 18% by weight of an ethanol solvent (manufacturer: OCI), and 2% by weight of a vanadium dopant were mixed. It was dried at 200° C. for 3 hours and then cured at 400° C. for 2 hours. It was thermally treated to under the conditions of 500° C. and 700 Torr and then carbonized or graphitized for 5 hours under the conditions of 2,000° C. and 760 Torr to solidify the composition.

A seed crystal was mounted on the inner upper end of a graphite crucible, the crucible was then wrapped with a thermal insulation material, and it was placed in a reaction chamber provided with a heating coil. The inside of the crucible was vacuumed, and argon gas was slowly charged thereto. In addition, the temperature in the crucible was raised to 2,400° C., and the pressure was raised to 700 Torr. Thereafter, the pressure was gradually lowered to reach 30 Torr, and a SiC single crystal ingot was grown on the seed crystal for 50 hours under these conditions to prepare a semi-insulating SiC single crystal ingot.

Comparative Example 2

A semi-insulating SiC single crystal ingot was prepared in the same manner as in the above Example, except that a porous graphite container loaded with a dopant was used instead of the solidified composition.

Evaluation Example 2-1: Measurement of Dopant Concentration

The semi-insulating SiC single crystal ingots prepared in Example 2 and Comparative Example 2 were measured for the concentration of the dopant using SIMS (secondary ion mass spectrometry). The results are shown in Table 2 below.

TABLE 2

|  | Dopant concentration (atoms/cc) |
|---|---|
| Example 1 | $1.3 \times 10^{17}$ |
| Comparative Example 1 | $5.3 \times 10^{16}$ |

As shown in Table 2 above, the concentration of the dopant of the semi-insulating SiC single crystal ingot prepared according to Example 2 was greater than the concentration of the dopant of the semi-insulating SiC single crystal ingot prepared according to Comparative Example 2.

Evaluation Example 2-2: Evaluation of Residual Powder Cross-Sectional Image

The residual powder cross-sectional images of the semi-insulating SiC single crystal ingots prepared in Example 2 and Comparative Example 2 were evaluated with the naked eyes.

FIG. 14 shows a cross-sectional image of residual powder of the semi-insulating SiC single crystal ingot of Example 2. FIG. 15 shows a cross-sectional image of residual powder of the semi-insulating SiC single crystal ingot of Comparative Example 2.

As shown in FIG. 14, in the semi-insulating SiC single crystal ingot prepared according to Example 2, sublimation was uniformly taken place through the entire region. In contrast, as shown in FIG. 15, in the semi-insulating SiC single crystal ingot of Comparative Example 2, sublimation was mainly taken place at the location (70) where the porous container was.

Evaluation Example 2-3: Evaluation of UV Image

The UV images of the semi-insulating SiC single crystal ingots prepared in Example 2 and Comparative Example 2 were evaluated with the naked eyes using UV lamp irradiation.

FIG. 16 shows a UV image of the semi-insulating SiC single crystal ingot of Example 2. FIG. 17 shows a UV image of the semi-insulating SiC single crystal ingot of Comparative Example 2.

The UV images of FIGS. 16 and 17 confirm the control of polymorphs. Specifically, green represents 4H, red represents 6H, and black represents 15R.

As shown in FIG. 16, in the semi-insulating SiC single crystal ingot prepared according to Example 2, the desired 4H was uniformly formed. In contrast, as shown in FIG. 17, in the semi-insulating SiC single crystal ingot prepared according to Comparative Example 2, 4H, 6H, and 15R were partially formed, resulting in a poor quality of the SiC single crystal ingot.

Evaluation Example 2-4: Evaluation of Surface Image

The surface images of the semi-insulating SiC single crystal ingots prepared in Example 2 and Comparative Example 2 were evaluated using an optical microscope.

FIG. 18 shows a surface image of the semi-insulating SiC single crystal ingot of Example 2. FIG. 19 shows a surface image of the semi-insulating SiC single crystal ingot of Comparative Example 2.

As shown in FIG. 18, the dopant concentration was maintained uniformly in the step of growing the SiC single crystal ingot in Example 2, so that the dopant was rarely precipitated. In contrast, as shown in FIG. 19, excessive doping was taken place in Comparative Example 2, whereby the dopant was precipitated.

Example 3

A SiC single crystal ingot was prepared using the apparatus for growing a SiC single crystal ingot as shown in FIG. 20.

10% by weight of a phenolic resin (product name: KC-5536, manufacturer: Kangnam Chemical), 70% by weight of an ethanol solvent (manufacturer: OCI), and 18% by weight of a vanadium carbide dopant were mixed. It was thermally treated under the conditions of 500° C. and 700 Torr and then carbonized or graphitized for 5 hours under the conditions of 2,000° C. and 760 Torr to prepare a porous body.

A seed crystal was mounted on the inner upper end of a graphite crucible, the crucible was then wrapped with a thermal insulation material, and it was placed in a reaction chamber provided with a heating coil. The inside of the crucible was vacuumed, and argon gas was slowly charged thereto. In addition, the temperature in the crucible was raised to 2,400° C., and the pressure was raised to 700 Torr. Thereafter, the pressure was gradually lowered to reach 30 Torr, and a SiC single crystal ingot was grown on the seed crystal for 50 hours under these conditions to prepare a SiC single crystal ingot having a diameter of about 6 inches.

Comparative Example 3

A SiC single crystal ingot was prepared in the same manner as in the above Example, except that the conventional apparatus for growing a SiC single crystal ingot as shown in FIG. 21 was used.

Evaluation Example 3-1: Evaluation of UV Image and Residual Powder

The UV images and residual powder of the SiC single crystal ingots prepared in Example 3 and Comparative Example 3 were evaluated with the naked eyes using a UV lamp.

FIG. 25 shows a UV image of the SiC single crystal ingot of Example 3. FIG. 26 shows a UV image of the SiC single crystal ingot of Comparative Example 3.

The UV images of FIGS. 25 and 26 confirm the control of polymorphs. Specifically, green represents 4H, red represents 6H, and black represents 15R. As shown in FIG. 25, in the SiC single crystal ingot prepared according to Example 3, the desired 4H was uniformly formed. In contrast, as shown in FIG. 26, in the SiC single crystal ingot prepared according to Comparative Example 3, 4H, 6H, and 15R were partially formed, resulting in a poor quality of the SiC single crystal ingot.

The invention claimed is:

1. A process for growing a SiC single crystal ingot, which comprises:
   (1) loading SiC (silicon carbide) and a dopant coated with a carbon-based material to a reaction vessel mounted with a seed crystal; and
   (2) growing a SiC single crystal ingot on the seed crystal, wherein a coating thickness of a portion coated with the carbon-based material is 1 μm to 100 μm.

2. The process of claim 1, wherein the carbon-based material is carbon black, graphite, or a combination thereof.

3. The process of claim 1, wherein the dopant coated with a carbon-based material is prepared by drying; curing; carbonization or graphitization; and pulverization of a composition comprising a carbon-containing polymer resin, a solvent, and a dopant.

4. The process of claim 3, wherein the carbon-containing polymer resin comprises at least one selected from the group consisting of phenolic resins, polyacrylamide resins, and thermosetting resins.

5. The process of claim 3, wherein the drying is carried out in a temperature range of 50° C. to 350° C., and the curing is carried out in a temperature range of 100° C. to 400° C.

6. The process of claim 3, wherein the carbonization or graphitization is carried out in a temperature range of 200° C. to 2,200° C. and a pressure condition of 1 Torr to 1,500 Torr.

7. The process of claim 1, wherein the dopant comprises at least one selected from the group consisting of vanadium (V), chromium (Cr), manganese (Mn), and cobalt (Co).

8. The process of claim 1, wherein the particle size of the dopant coated with a carbon-based material is 1 μm to 2,000 μm.

* * * * *